(12) United States Patent
Wang et al.

(10) Patent No.: US 7,807,484 B2
(45) Date of Patent: Oct. 5, 2010

(54) LIGHT-EMITTING DIODE DEVICE AND METHOD FOR FABRICATING THE SAME

(75) Inventors: Wei-Ko Wang, Taoyuan (TW); Tzu-Han Lin, Hsinchu (TW)

(73) Assignee: VisEra Technologies Company Limited, Hsinchu (TW)

( * ) Notice: Subject to any disclaimer, the term of this patent is extended or adjusted under 35 U.S.C. 154(b) by 20 days.

(21) Appl. No.: 12/251,957

(22) Filed: Oct. 15, 2008

(65) Prior Publication Data

US 2010/0090235 A1 Apr. 15, 2010

(51) Int. Cl.
*H01L 21/00* (2006.01)

(52) U.S. Cl. .................. 438/29; 438/237; 438/328; 438/979; 257/98; 257/367; 257/594; 257/656

(58) Field of Classification Search .......... 257/367, 257/594, 656, E31.084, E31.099, E31.105, 257/E27.051; 438/237, 328, 979, FOR. 157, 438/FOR. 287, FOR. 415, FOR. 416
See application file for complete search history.

(56) References Cited

U.S. PATENT DOCUMENTS

| 2004/0136197 A1* | 7/2004 | Ishida ................ 362/487 |
| 2007/0263403 A1* | 11/2007 | Yatsuda et al. ........ 362/509 |
| 2009/0127567 A1* | 5/2009 | Wang ................. 257/79 |

* cited by examiner

*Primary Examiner*—N Drew Richards
*Assistant Examiner*—Joannie A Garcia
(74) *Attorney, Agent, or Firm*—Muncy, Geissler, Olds & Lowe, PLLC

(57) ABSTRACT

A light-emitting diode (LED) device is disclosed. The LED device includes a semiconductor substrate with a light-emitting diode chip disposed thereon. At least two isolated outer wiring layers are disposed on the bottom surface of the semiconductor substrate and are electrically connected to the light-emitting diode chip, serving as input terminals. A lens module is adhered to the top surface of the semiconductor substrate to cap the light-emitting diode chip. In one embodiment, the lens module comprises a glass substrate having a first cavity formed at a first surface thereof, a fluorescent layer formed over a portion of a first surface exposed by the first cavity, facing the light-emitting diode chip, and a molded lens formed over a second surface of the glass carrier opposing to the first surface.

22 Claims, 11 Drawing Sheets

LIGHT-EMITTING DIODE DEVICE AND METHOD FOR FABRICATING THE SAME

BACKGROUND OF THE INVENTION

1. Field of the Invention

The invention relates to a light-emitting diode (LED) device and more particularly to LED devices with a lens module having a fluorescent material and methods for fabricating the same.

2. Description of the Related Art

Light-emitting diode (LED) devices are solid-state light sources and have been known for years. The LED devices are based on the recombination of electron-hole pairs in a pn-junction in a semiconductor material which is forward-biased. Advantages of LED devices compared with traditional lamps are lower power consumption and longer lifespan. In particular, because white light LED devices have a high color rendering index (CRI), it has become one of the most popular illuminating devices used.

A white light LED device can be obtained by mixing red, green, and blue lights using a combination of a red light LED chip (or die), a green light LED chip, and a blue light LED chip to form the white light LED device. However, the above three-in-one white light LED device is expensive because it requires three LED chips for different emitted lights. Moreover, the CRI is reduced due to the different light-emitting efficiencies for each of the three LED chips.

In order to address the above drawbacks, a white light LED device has been developed by using a combination of a blue light LED device combined with a fluorescent material, such as a phosphor material. The blue light passes through the fluorescent red and green phosphor material, such that the combination of blue, red, and green lights produces a white light. Currently, such a white light LED device is formed by filling an epoxy resin containing phosphors around a blue light LED chip and then a lens is capped thereon. However, poor uniformity of the filled epoxy resin reduces the light-emitting properties of the LED devices. Another method to form the white light LED device is to fill a transparent protective resin or glue around a blue light LED chip followed by coating an epoxy resin layer containing phosphors thereon and capping a lens on top. However, the coating rate of the epoxy resin layer is slow and it is also difficult to control the uniformity of the epoxy resin layer. Further another method to form the white light LED device is to form a lens on a blue light LED chip followed by coating an epoxy resin layer containing phosphors thereon and covering the lens with a transparent protective resin or glue. However, the coating rate of the epoxy resin layer is also slow and the manufacturing cost is high. Moreover, in the above methods, the blue light LED chips are packaged by chip level packaging techniques, which are time consuming, thereby limiting a throughput for packaging of the blue light LED chip.

Therefore, there is a need to develop a novel LED device capable of addressing the above problems.

BRIEF SUMMARY OF THE INVENTION

A detailed description is given in the following embodiments with reference to the accompanying drawings. A light-emitting diode (LED) device and a method for fabricating the same are provided. An embodiment of an LED device comprises a semiconductor substrate with a light-emitting diode chip disposed thereon. At least two isolated outer wiring layers are disposed on the bottom surface of the semiconductor substrate and are electrically connected to the light-emitting diode chip, serving as input terminals. A lens module is adhered to the top surface of the semiconductor substrate to cap the light-emitting diode chip. In one embodiment, the lens module comprises a glass substrate having a first cavity formed at a first surface thereof, a fluorescent layer formed over a portion of a first surface exposed by the first cavity, facing the light-emitting diode chip, and a molded lens formed over a second surface of the glass carrier opposing to the first surface, wherein the second surface of the glass substrate is a planar surface without any cavity formed therein.

An embodiment of a method for fabricating an LED device comprises providing a semiconductor wafer with a plurality of light-emitting diode chips formed thereon. The light-emitting diode chips are capped with a lens plate, in which the lens plate comprises a glass substrate having a plurality of first cavities formed at a first surface thereof, a fluorescent layer formed over a portion of a first surface exposed by the plurality of the first cavities, respectively facing one of the light-emitting diode chips, and a plurality of molded lens formed over a second surface of the glass carrier opposing to the first surface, wherein the second surface of the glass substrate is a planar surface without any cavity formed therein. The bottom surface of the semiconductor wafer is etched to form a plurality of notches between the adjacent cavities to form individual semiconductor substrates. The lens plate is cut from the plurality of notches to form individual lens modules on the corresponding semiconductor substrates.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
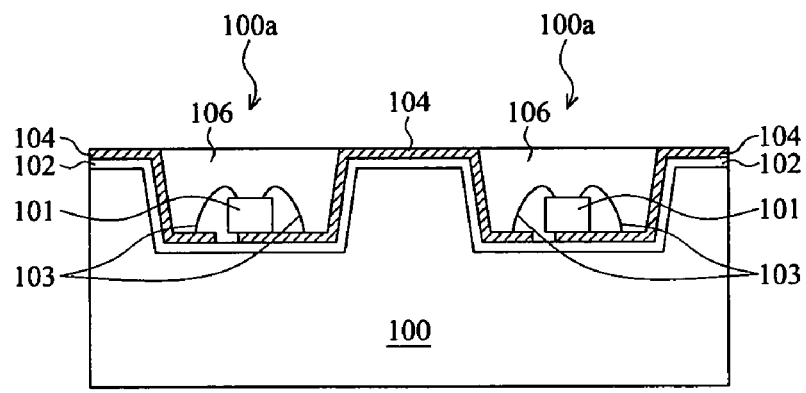
FIGS. 2A to 2D are cross sections of an exemplary embodiment of a method for fabricating LED devices according to the invention.
Figure 2B:
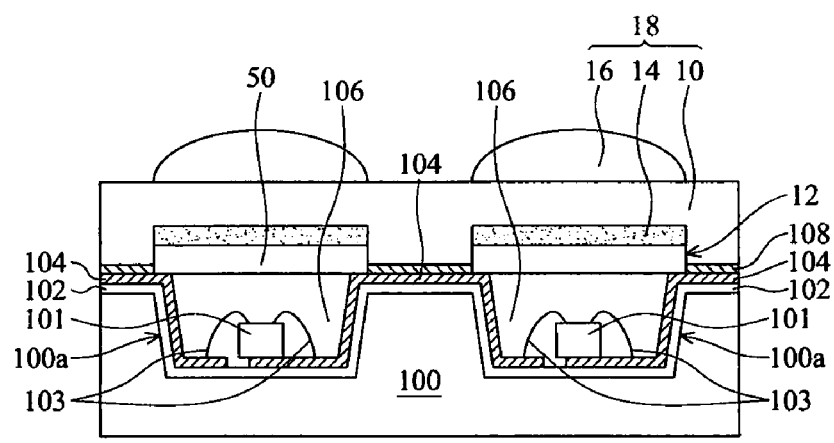
Figure 2C:
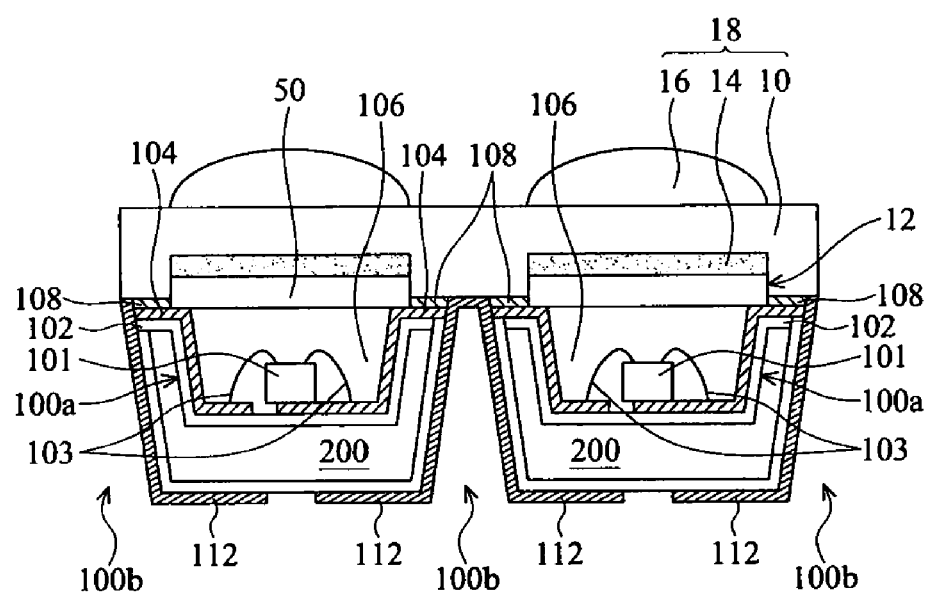
Figure 2D:
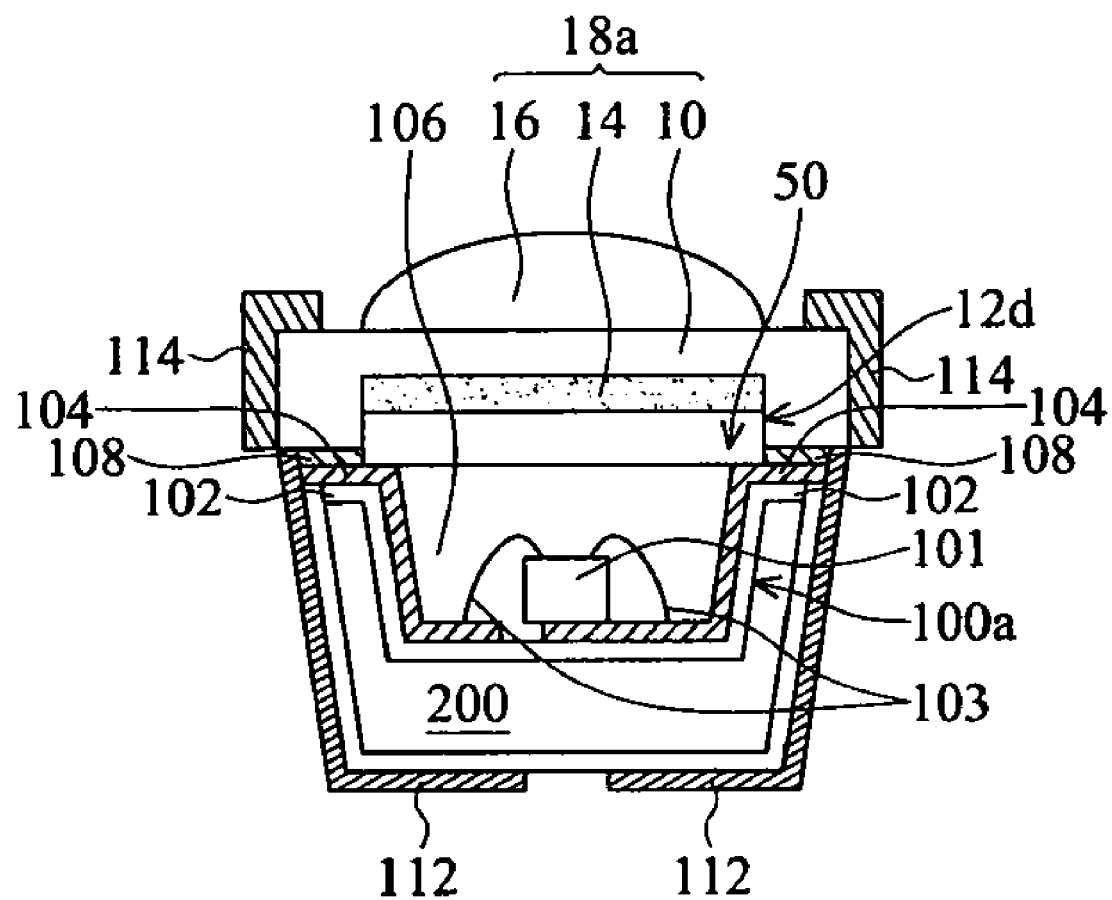

FIGS. 2D, 3, 4D and 5, are cross sections of various exemplary embodiments of LED devices according to the invention, respectively. Elements in FIGS. 3, 4D and 5 that are the same as those in FIG. 2D are labeled with the same reference numbers as in FIG. 2D and are not described again for brevity. Referring to FIG. 2D, the LED device comprises a semiconductor substrate 200, such as a silicon substrate or other semiconductor substrates well known in the art, having a cavity 100a. The semiconductor substrate 200 may contain a variety of elements, including, for example, transistors, resistors, and other semiconductor elements well known in the art. In order to simplify the diagram, the variety of elements is not depicted. At least two isolated inner wiring layers 104 are disposed in the cavity 100a. A light-emitting diode (LED) chip 101, such as a blue light LED chip (or die), is disposed in the cavity 100a and is electrically connected to the inner wiring layers 104 by wire bonding through wiring lines 103. In another embodiment, the LED chip 101 can be electrically connected to the inner wiring layers 104 by a flip chip method. At least two isolated outer wiring layers 112 are disposed on the bottom surface of the semiconductor substrate 200, serving as input terminals. In the embodiment, the outer wiring layers 112 extend to sidewalls of the semiconductor substrate 200 and the inner wiring layers 104 extend to the top surface of the semiconductor substrate, such that the outer wiring layers 112 are directly connected to the inner wiring layers 104, respectively, so as to be electrically connected to the LED chip 101. A lens module 18a is adhered to the top surface of the semiconductor substrate 200 by an adhesion layer 108 to cap the cavity 100a. In the embodiment, the lens module 18a comprises a molded lens 16, and a fluorescent layer 14 under the molded lens 16 and the fluorescent layer 14 faces the LED chip 101. In addition, a glass substrate 10a is interposed between the fluorescent layer 14 and the molded lens 16, having a cavity 12 for disposing the fluorescent layer 14. The fluorescent layer 14 may comprise phosphor. Moreover, the fluorescent layer 14 has a uniform thickness, such that the correlated color temperature (CCT) of the emitted light through the fluorescent layer 14 can be more uniform. A reflective layer 114, such as Ag metal or well reflective material, can be coated on the edge of the lens module 18a for prevention of light leakage. Thus, brightness of the LED device can be increased.

Figure 3:
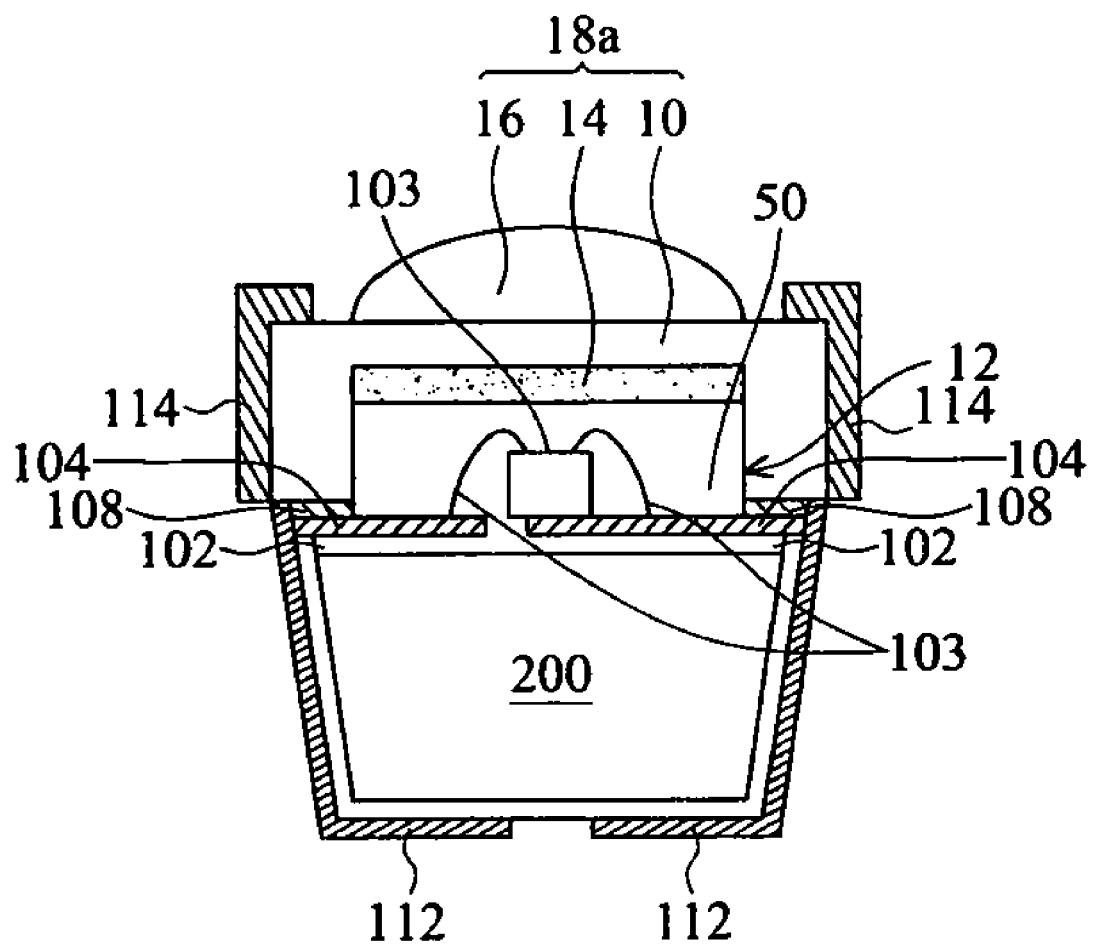
FIG. 3 is a cross section of an exemplary embodiment of an LED device according to the invention.

Referring to FIG. 3, unlike the LED device shown in FIG. 2D, the semiconductor device 200 is formed without any cavity 100a and has a planar surface. The inner wiring layers 104 are formed as a planar film overlying the semiconductor device 200 and the LED chip 101 is electrically connected to the inner wiring layers 104 by wire bonding through wiring lines 103, such that the two outer wiring layers 112a are directly connected to the inner wiring layers 104 and thereby electrically connected to the LED chip 101, respectively.

Figure 4A:
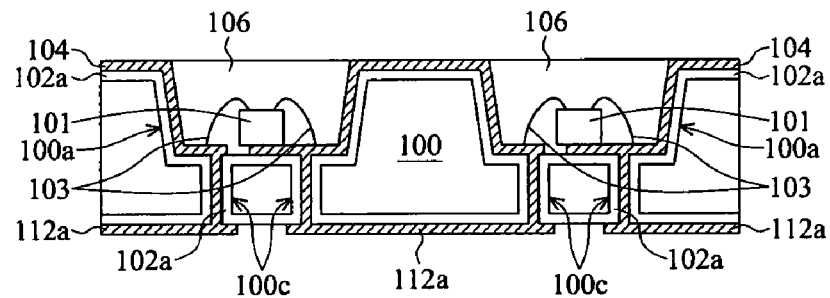
FIGS. 4A to 4D are cross sections of an exemplary embodiment of a method for fabricating LED devices according to the invention.
Figure 4B:
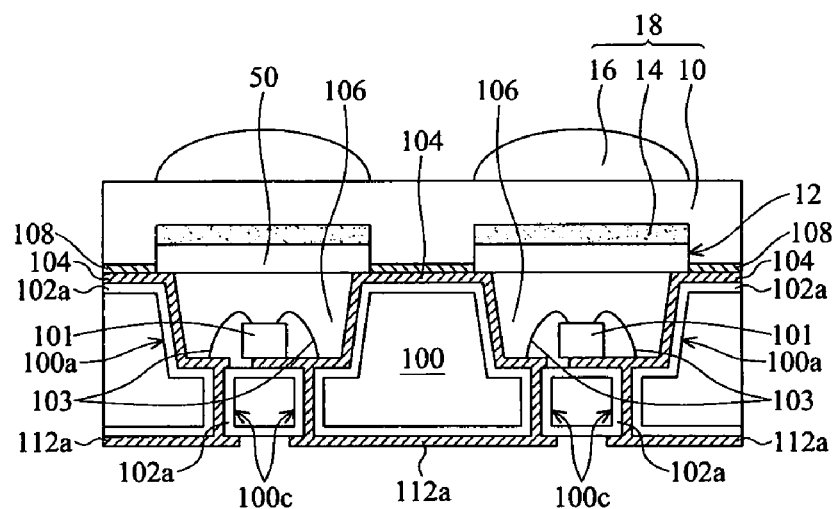
Figure 4C:
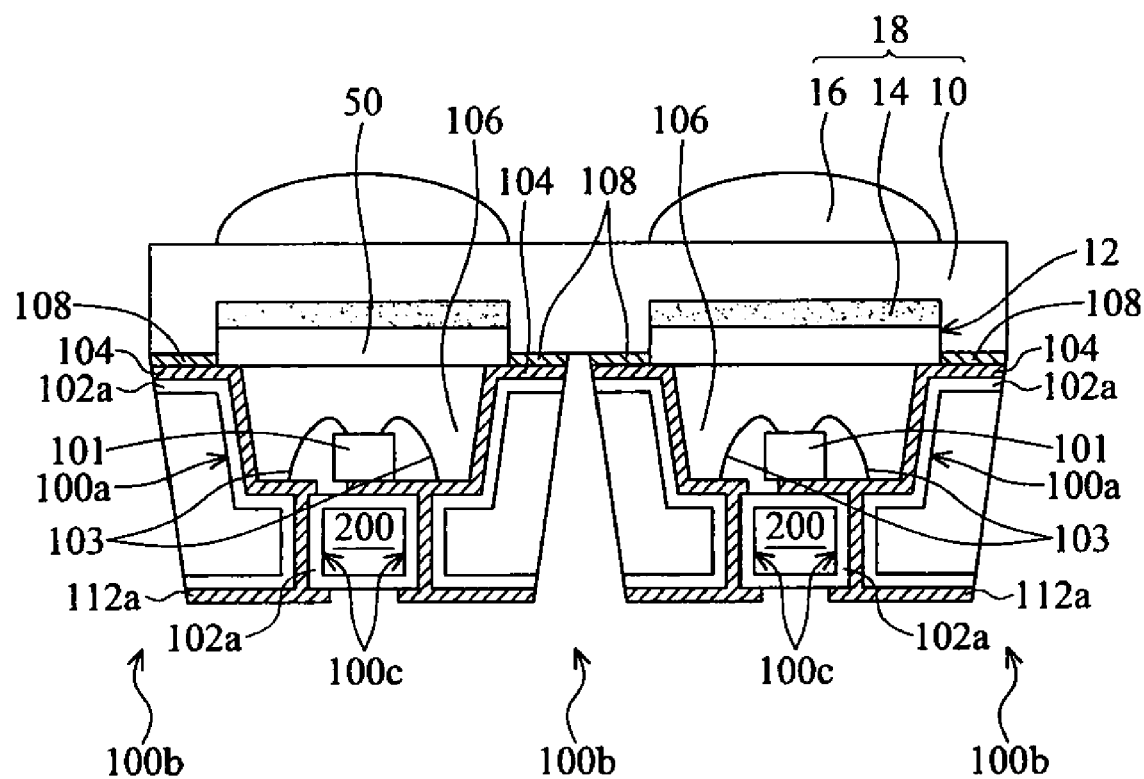
Figure 4D:
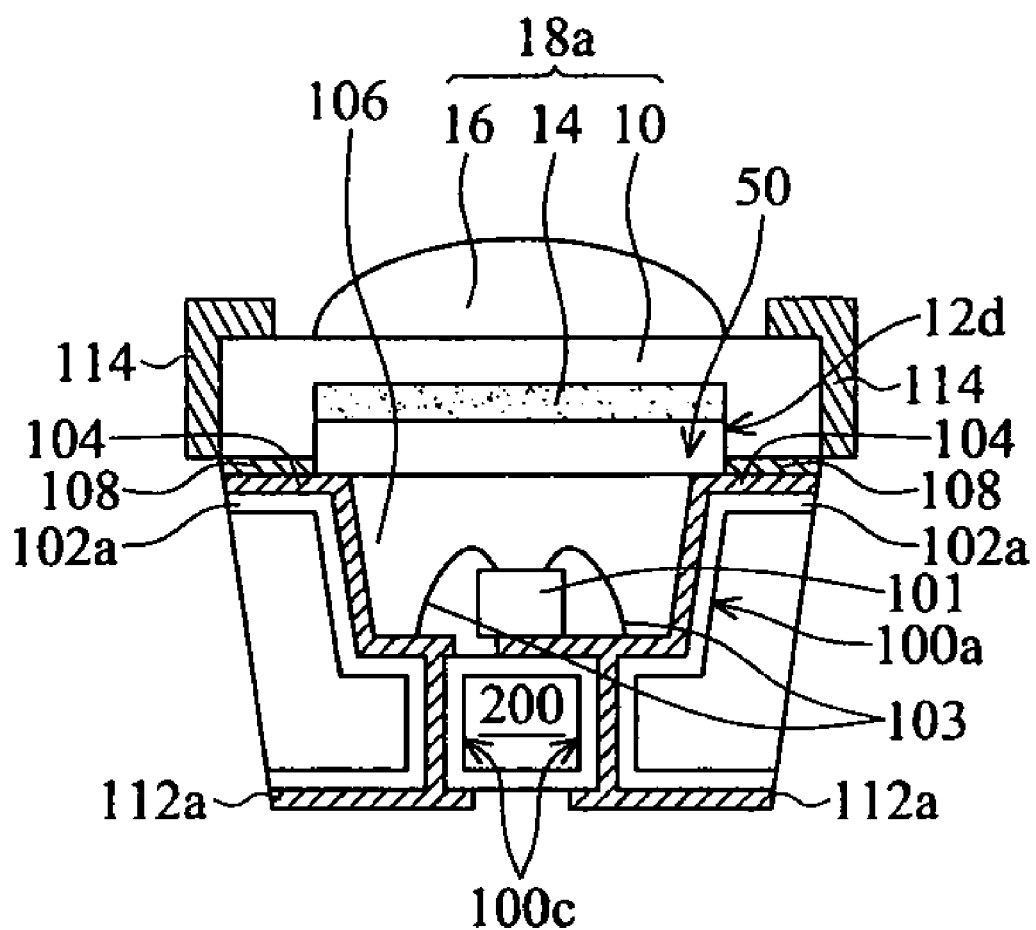

Referring to FIG. 4D, unlike the LED device shown in FIG. 2D, the semiconductor device 200 may comprise at least two through openings 100c under the cavity 100a, such that at least two outer wiring layers 112a are electrically connected to the inner wiring layers 104 by the through openings 100c, respectively.

Figure 5:
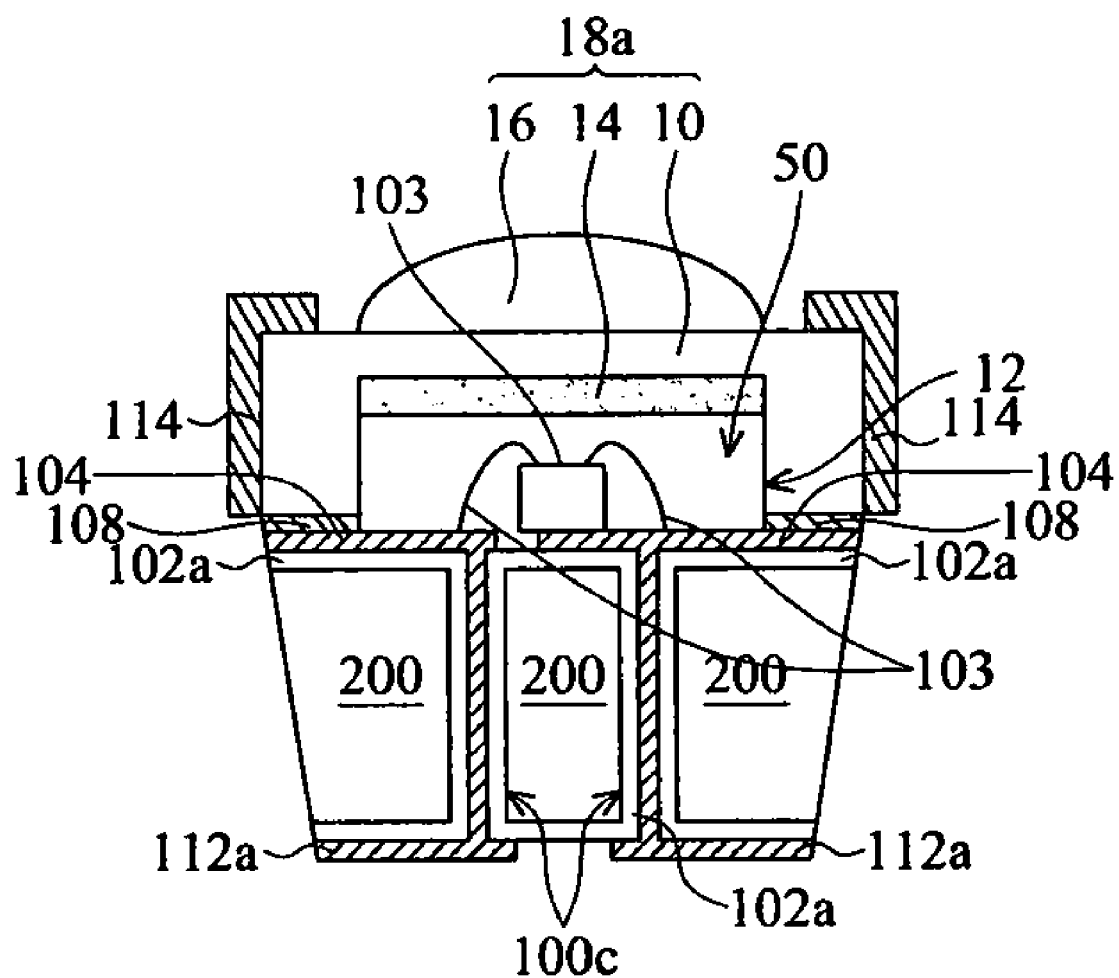
FIG. 5 is a cross section of another exemplary embodiment of an LED device according to the invention.

Referring to FIG. 5, unlike the LED device shown in FIG. 4D, the semiconductor device 200 is formed without any cavity 100a and has a planar surface. The inner wiring layers 104 are formed as a planar film overlying the semiconductor device 200 and the LED chip 101 is electrically connected to the inner wiring layers 104 by wire bonding through wiring lines 103. The semiconductor device 200 may comprise at least two through openings 100c, such that at least two outer wiring layers 112a are electrically connected to the inner wiring layers 104 by the through openings 100c, respectively.

Referring to FIGS. 2A to 2D, which are cross sections of an exemplary embodiment of a method for fabricating LED devices according to the invention. As shown in FIG. 2A, a semiconductor wafer 100, such as a silicon wafer or other semiconductor wafers well known in the art, is provided. The semiconductor wafer 100 comprises a plurality of cavities 100a adjacent to each other. In order to simplify the diagram, only two adjacent cavities 100a are depicted.

An insulating layer 102, such as a silicon oxide layer formed by thermal oxidation, chemical vapor deposition (CVD) or other conventional deposition processes, and a metal layer (not shown) are successively and conformally formed on the top surface of the semiconductor wafer 100 and the inner surface of each cavity 100a. The metal layer may comprise aluminum (Al), copper (Cu), nickel (Ni), aurum (Au), or argentum (Ag) or alloys thereof. Moreover, the metal layer is then patterned by a lithography and etching process to form at least two isolated inner wiring layers 104 in each cavity 100a. The inner wiring layers 104 also extend to the top surface of the semiconductor wafer 100.

A plurality of LED chips 102 are correspondingly provided in the plurality of cavities 100a and is electrically connected to the corresponding inner wiring layers 104 by wire bonding through wiring lines 103 or by a flip chip method through bumps (not shown). A transparent resin 106, such as epoxy or glue, may be optionally filled into each cavity 100a to cover and protective each light-emitting diode chip 101.

Figure 1A:
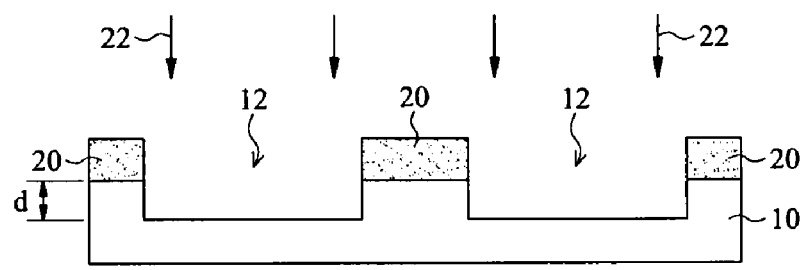
FIGS. 1A to 1D are cross sections of an exemplary embodiment of a method for fabricating a lens plate according to the invention.
Figure 1B:
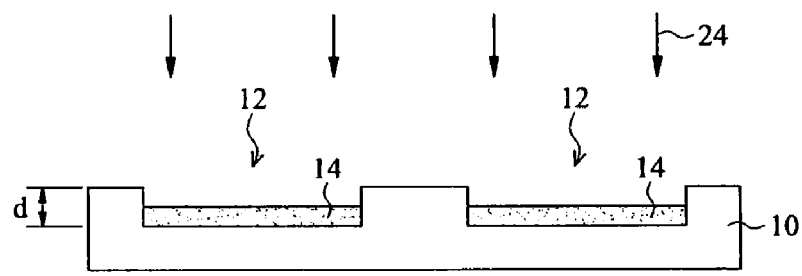
Figure 1C:
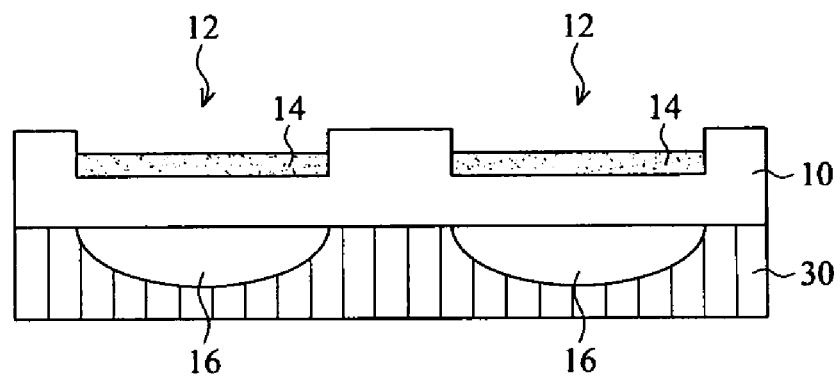
Figure 1D:
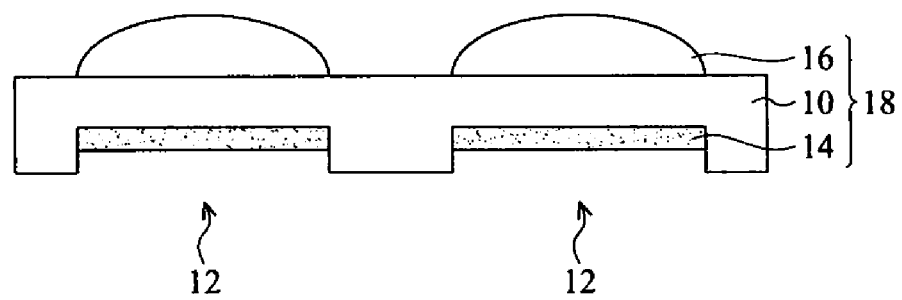

As shown in FIG. 2B, the plurality of cavities 100a of the semiconductor wafer 100 is capped with a lens plate 18 by an adhesion layer 108, such as an epoxy layer, having a space 50 formed between the transparent resin 106 and the lens plate 18. FIGS. 1A to 1D, are cross sections showing a method for fabricating the lens plate 18. In FIG. 1A, a glass wafer 10 is provided. A patterned mask layer 20 is formed over a surface of the glass wafer 10 to expose portions of the glass wafer 10. A process 22, such as an etching process, is performed to remove portions of the glass wafer 10 exposed by the patterned mask layer 20, thereby forming a plurality of cavities 12 in the glass wafer 10. Each of the cavities 12 has a depth d of about 50~350 µm to a surface of the glass wafer 10. As shown in FIG. 1A, the cavities 12 are illustrated with a substantially rectangular shaped cross-section but is not limited thereto. In another embodiment, the cavities 12 can be formed with a cross-section of, for example, trapezoid or other polygonal shape (not shown). In yet another embodiment, the cavities 12 can be formed with a cross section having a curved surface of, for example, substantially circular, oval, or parabolic shape (not shown). In yet another embodiment, the process 22 is not limited to the etching process illustrated in the FIG. 1A, and can be a mechanical grinding process (not shown) directly performed to the glass wafer 10 and the patterned mask layer 20 can be omitted in this embodiment.

In FIG. 1B, the patterned mask layer 20 is first removed and a process 24 is then performed to form a plurality of fluorescent layers 14, such as phosphor layers, on the bottom surface of the cavities 12 of the glass wafer 10 by process methods such as electrophoresis deposition, gel dispense, or screen printing. A transparent conductive layer (not shown) is needed and is interposed between the fluorescent layer 14 and the glass wafer 10 while performing the electrophoresis deposition method for forming the fluorescent layer 14. The plurality of fluorescent layers 14 correspond to the plurality of cavities 100a as shown in FIG. 2A. In order to simplify the diagram, only two adjacent fluorescent layers 14 are depicted. Since the fluorescent layer 14 is formed by methods such as electrophoresis deposition, gel dispense, or screen printing, the profile of fluorescent layer 14 can be easily controlled and formed as a substantially planar film, thereby improving film uniformity thereof. In the embodiment, the central portion of the fluorescent layer 12 has a thickness substantially the same as that of the edge portion thereof. FIGS. 1E and 1F are top views of the lens plate illustrated in FIG. 1B, respectively showing the cavities 12 with a rectangular shape (FIG. 1E) or a circular shape (FIG. 1F). The cavities 12 can be also formed with other polygonal shapes rather than those illustrated in FIGS. 1E and 1F and are not limited thereto.

Figure 1E:
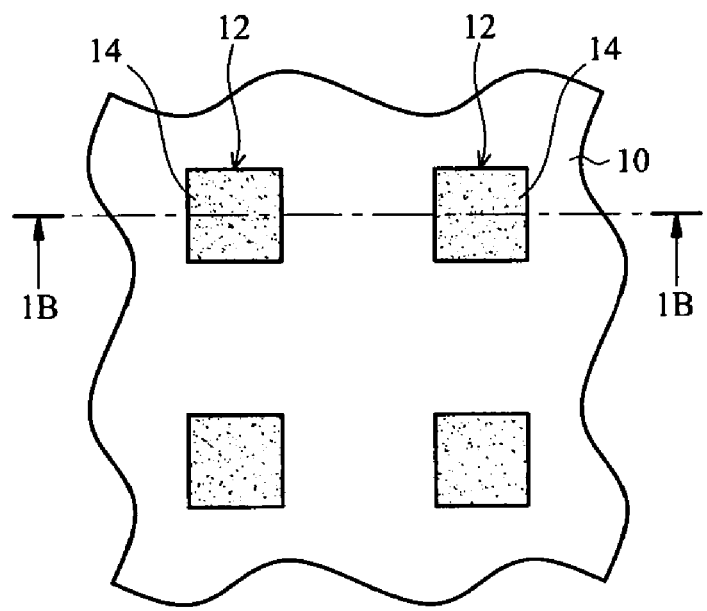
FIGS. 1E and 1F are top views of an exemplary embodiment of a lens plate illustrated in FIG. 1B according to the invention.
Figure 1F:
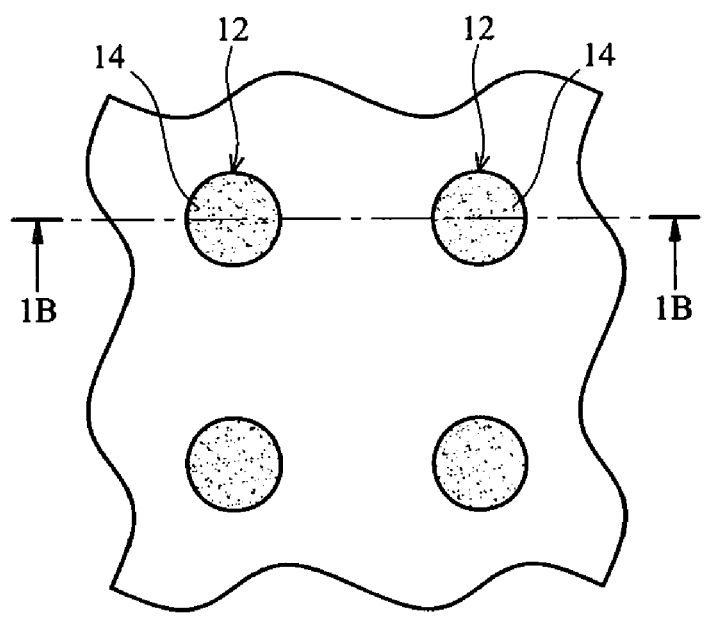

In FIG. 1C, after formation of the fluorescent layers 14, a plurality of molded lenses 16 comprising, for example, a resin material, is formed on another top surface of the glass wafer 10 corresponding to the plurality of fluorescent layers 14 by a mold 30, such that the glass wafer 10 is interposed between each fluorescent layers 14 and each molded lens 16. After removal of the mold 30, a lens plate 18 is completed, as shown in FIG. 1D. Each fluorescent layer 14 of the lens plate 18 faces to the corresponding LED chip 101 after the lens plate 18 is adhered to the semiconductor wafer 100. The semiconductor wafer 100 is thinned by grinding the bottom surface thereof.

As shown in FIG. 2C, the grounded bottom surface of the semiconductor wafer 100 and the overlying adhesion layer 108 are successively etched to form a plurality of notches 100b between the adjacent cavities 100a to form individual semiconductor substrates 200 and expose the glass wafer 10. At least two isolated outer wiring layers 112 is formed on the bottom surface of each semiconductor substrate 200 by deposing a metal layer (not shown) followed by a lithography and etching process. The outer wiring layers 112 may comprise the same or similar material as the inner wiring layers 104. In the embodiment, the outer wiring layers 112 serve as input terminals and extend to sidewalls of each semiconductor substrate 200 and the exposed glass wafer 10, such that the two outer wiring layers 112 are directly connected to the corresponding inner wiring layers 104 and are electrically connected to the corresponding LED chip 101. In some embodiments, the molded lenses 14 can be formed on the glass wafer 10 after grinding the bottom surface of the semiconductor wafer 100, forming notches 100b, and forming the isolated outer wiring layers 112.

As shown in FIG. 2D, the lens plate 18 is cut from the plurality of notches 100b to form individual lens modules 18a on the corresponding semiconductor substrates 200. In order to simplify the diagram, only a semiconductor substrate 200 having a lens module 18a thereon is depicted. Next, the edge of each lens module 18a is coated with a reflective layer 114 for prevention of light leakage, thereby increasing brightness of the LED chips 101 and as a result, completing fabrication of the LED devices of this embodiment.

Referring to FIG. 3, an LED device formed by an exemplary method (not shown) modified by that illustrated in FIG. 2A~2D is illustrated. In this embodiment, the semiconductor device 200 is provided without any cavity 100a therein and has a planar surface. Moreover, the inner wiring layers 104 are formed as a planar film overlying the semiconductor device 200 and the LED chip 101 is electrically connected to the inner wiring layers 104 by wire bonding through wiring lines 103, such that the two outer wiring layers 112a are directly connected to the inner wiring layers 104 and thereby electrically connected to the LED chip 101, respectively.

Referring to FIGS. 4A to 4D, which are cross sections of another exemplary embodiment of a method for fabricating LED devices according to the invention. Elements in FIGS. 4A to 4D that are the same as those in FIGS. 2A to 2D are labeled with the same reference numbers as in FIGS. 2A to 2D and are not described again for brevity. As shown in FIG. 4A, a semiconductor wafer 100 comprising a plurality of cavities 100a adjacent to each other and at least two through openings 100c under each cavity 100a is provided.

An insulating layer 102a, such as a silicon oxide layer formed by thermal oxidation, chemical vapor deposition (CVD) or other conventional deposition processes, is conformally formed on the top and bottom surfaces of the semiconductor wafer 100, the inner surface of each cavity 100a, and the inner surface of each through openings 100c. Next, two metal layers (not shown) is conformally formed on the insulating layer 102a overlying the top and bottom surfaces of the semiconductor wafer 100, respectively, and fill the through openings 100c. The metal layers are then patterned by a lithography and etching process to form at least two isolated inner wiring layers 104 in each cavity 100a and at least two isolated outer wiring layers 112a on the semiconductor wafer 100 under each cavity 100a. Thus, the two outer wiring layers 112a under each cavity 100a are electrically connected to the corresponding inner wiring layers 104 by the through openings 100c.

As shown in FIG. 4B, the plurality of cavities 100a of the semiconductor wafer 100 is capped with a lens plate 18 shown in FIG. 1D.

As shown in FIG. 4C, the bottom surface of the semiconductor wafer 100 and the overlying adhesion layer 108 are successively etched to form a plurality of notches 100b between the adjacent cavities 100a to form individual semiconductor substrates 200 and expose the glass wafer 10.

As shown in FIG. 4D, the lens plate 18 is cut from the plurality of notches 100b to form individual lens modules 18a on the corresponding semiconductor substrates 200. Also, the edge of each lens module 18a is coated with a reflective layer 114 for prevention of light leakage and as a result, completing fabrication of the LED devices of this embodiment.

Referring to FIG. 5, an LED device formed by an exemplary method (not shown) modified by that illustrated in FIG. 4A~4D is illustrated. In this embodiment, the semiconductor device 200 is provided without any cavity 100a therein and has a planar surface. The inner wiring layers 104 are formed as a planar film overlying the semiconductor device 200 and the LED chip 101 is electrically connected to the inner wiring layers 104 by wire bonding through wiring lines 103. The semiconductor device 200 may comprise at least two through openings 100c, such that at least two outer wiring layers 112a are electrically connected to the inner wiring layers 104 by the through openings 100c, respectively.

According to the aforementioned embodiments, the fluorescent layers are formed on an inner surface of a plurality of cavities within a glass carrier and have a substantially planar film thickness. Compared to the conventional fluorescent layer filled around an LED chip, uniformity of the fluorescent layer can be improved. Moreover, since the fluorescent layers are formed by methods such as electrophoresis deposition, gel dispense, or screen printing, good profile control of the fluorescent layer can be obtained. Furthermore, the lens and the fluorescent layer formed on opposing sides of a glass carrier by electrophoresis deposition, gel dispense, or screen printing and molding are easily reworkable, thus reducing manufacturing costs. Additionally, since the LED devices are packaged by a wafer level package, high production rate can be obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) device, comprising:
a semiconductor substrate with a light-emitting diode chip disposed thereon;

least two isolated outer wiring layers disposed on a bottom surface of the semiconductor substrate and electrically connected to the light-emitting diode chip, serving as input terminals; and a lens module adhered to a top surface of the semiconductor substrate to cap the light-emitting diode chip, comprising:

a glass substrate having a first cavity formed at a first surface thereof;

a fluorescent layer formed over a portion of a first surface exposed by the first cavity, facing the light-emitting diode chip; and a molded lens formed over a second surface of the glass substrate opposing to the first surface, wherein the second surface of the glass substrate is a planar surface without any cavity formed therein.

2. The LED device of claim 1, wherein the semiconductor substrate is formed with a planar surface and the light-emitting diode chip is disposed on the planar surface.

3. The LED device of claim 1, wherein the semiconductor substrate is formed with a second cavity and the light-emitting diode chip is disposed in the second cavity.

4. The LED device of claim 1, wherein a central portion of the fluorescent layer has a thickness substantially the same as that of an edge portion of the fluorescent layer.

5. The LED device of claim 1, further comprising a reflective layer coated on an edge of the lens module.

6. The LED device of claim 2, further comprising at least two isolated inner wiring layers disposed over the planar surface of the semiconductor substrate, electrically connecting between the light-emitting diode chip and the isolated outer wiring layers.

7. The LED device of claim 3, further comprising at least two isolated inner wiring layers disposed in the second cavity, electrically connecting between the light-emitting diode chip and the isolated outer wiring layers.

8. The LED device of claim 6, wherein the semiconductor substrate comprises at least two through openings under the planar surface of the semiconductor substrate, such that the outer wiring layers are electrically connected to the inner wiring layers by the through openings, respectively.

9. The LED device of claim 7, wherein the semiconductor substrate comprises at least two through openings under the second cavity, such that the outer wiring layers are electrically connected to the inner wiring layers by the through openings, respectively.

10. The LED device of claim 6, wherein the outer wiring layers extend to sidewalls of the semiconductor substrate and the inner wiring layers extend to the top surface of the semiconductor substrate, such that the outer wiring layers are directly connected to the inner wiring layers, respectively.

11. The LED device of claim 7, wherein the outer wiring layers extend to sidewalls of the semiconductor substrate and the inner wiring layers extend to the top surface of the semiconductor substrate, such that the outer wiring layers are directly connected to the inner wiring layers, respectively.

12. The LED device of claim 1, further comprising a space formed between the light-emitting diode chip and the fluorescent layer.

13. The LED device of claim 3, further comprising a transparent resin filled into the second cavity to cover the light-emitting diode chip.

14. A method for fabricating a light-emitting diode (LED) device, comprising:

providing a semiconductor wafer with a plurality of light-emitting diode chips formed thereon;

capping the light-emitting diode chips with a lens plate, wherein the lens plate comprises:

a glass substrate having a plurality of first cavities formed at a first surface thereof;

a fluorescent layer formed over a portion of a first surface exposed by the plurality of the first cavities, respectively facing one of the light-emitting diode chips; and a plurality of molded lens formed over a second surface of the glass substrate opposing to the first surface, wherein the second surface of the glass substrate is a planar surface without any cavity formed therein;

etching a bottom surface of the semiconductor wafer to form a plurality of notches between the first cavities to form individual semiconductor substrates; and cutting the lens plate from the plurality of notches to form individual lens modules on the corresponding semiconductor substrates.

15. The method of claim 14, wherein the semiconductor wafer is formed with a planar surface.

16. The method of claim 14, wherein the semiconductor wafer is formed with a plurality of second cavities adjacent to each other and the light-emitting diode chips are formed in the second cavities, respectively.

17. The method of claim 14, further forming at least two isolated outer wiring layers on the bottom surface of each semiconductor substrate and electrically connected to the corresponding light-emitting diode chip to serve as input terminals.

18. The method of claim 17, further forming at least two isolated inner wiring layers over the semiconductor substrate to electrically connect between the corresponding light-emitting diode chip and the corresponding outer wiring layers.

19. The method of claim 18, wherein each semiconductor substrate further comprises at least two through openings under the semiconductor substrate, such that the outer wiring layers are electrically connected to the corresponding inner wiring layers by the through openings.

20. The method of claim 14, wherein the outer wiring layers extend to sidewalls of each semiconductor substrate and the inner wiring layers extend to a top surface of each semiconductor substrate, such that the outer wiring layers are directly connected to the corresponding inner wiring layers.

21. The method of claim 14, wherein a central portion of the fluorescent layer has a thickness substantially the same as that of an edge portion of the fluorescent layer.

22. The method of claim 14, further coating a reflective layer on an edge of each lens module.

* * * * *